United States Patent [19]
Sakai

[11] Patent Number: 5,867,260
[45] Date of Patent: Feb. 2, 1999

[54] CONDUCTIVE BALL MOUNTING APPARATUS AND MOUNTING METHOD OF CONDUCTIVE BALL

[75] Inventor: Tadahiko Sakai, Fukuoka, Japan

[73] Assignee: Matsushita Electric Industrial Co., Ltd., Osaka, Japan

[21] Appl. No.: 799,366

[22] Filed: Feb. 14, 1997

[30] Foreign Application Priority Data

Feb. 19, 1996 [JP] Japan .................................. 8-030299

[51] Int. Cl.$^6$ ....................... B23Q 15/013; B23K 35/14; G01N 21/01
[52] U.S. Cl. ............................. 356/237; 228/105; 228/9; 228/41; 228/246
[58] Field of Search ............................. 228/41, 6.2, 44.7, 228/49.5, 56.5, 105, 254, 180.22, 246; 250/559.4; 356/237

[56] References Cited

U.S. PATENT DOCUMENTS

| | | | |
|---|---|---|---|
| 5,465,152 | 11/1995 | Bilodeau et al. | 356/237 |
| 5,601,229 | 2/1997 | Nakazato et al. | 228/254 |
| 5,615,823 | 4/1997 | Noda et al. | 228/246 |

OTHER PUBLICATIONS

"Concept of Automatism," published by Chuan–Hwa Book Store, 1992, pp. 132–139, 172, 173, 182–185.
"Accurate meter and mechanical element detecting," published by New–Technology Co., 1993, pp. 130, 131.
"Ingenious Mechanism," vol. II, published by Kuo–Shing Co., 1984, pp. 288, 289, 460 and 467.

*Primary Examiner*—Frank G. Font
*Assistant Examiner*—Zandra V. Smith
*Attorney, Agent, or Firm*—Stevens, Davis, Miller & Mosher, L.L.P.

[57] ABSTRACT

A conductive ball mounting apparatus and a mounting method for mounting a conductive ball for forming a bump without erroneously mounting an additional conductive ball in a workpiece, comprising a workpiece positioning section, a conductive ball feeding section, a mounting head provided with a plurality of suction holes each of which has a recess capable of storing one conductive ball on the bottom surface of the head, a moving device for moving the mounting head between the workpiece positioning section and the conductive ball feeding section, and a detecting device for detecting conductive balls erroneously additionally attached to the bottom surface of the mounting head without being stored in recesses arranged on the moving route of the mounting head.

9 Claims, 7 Drawing Sheets

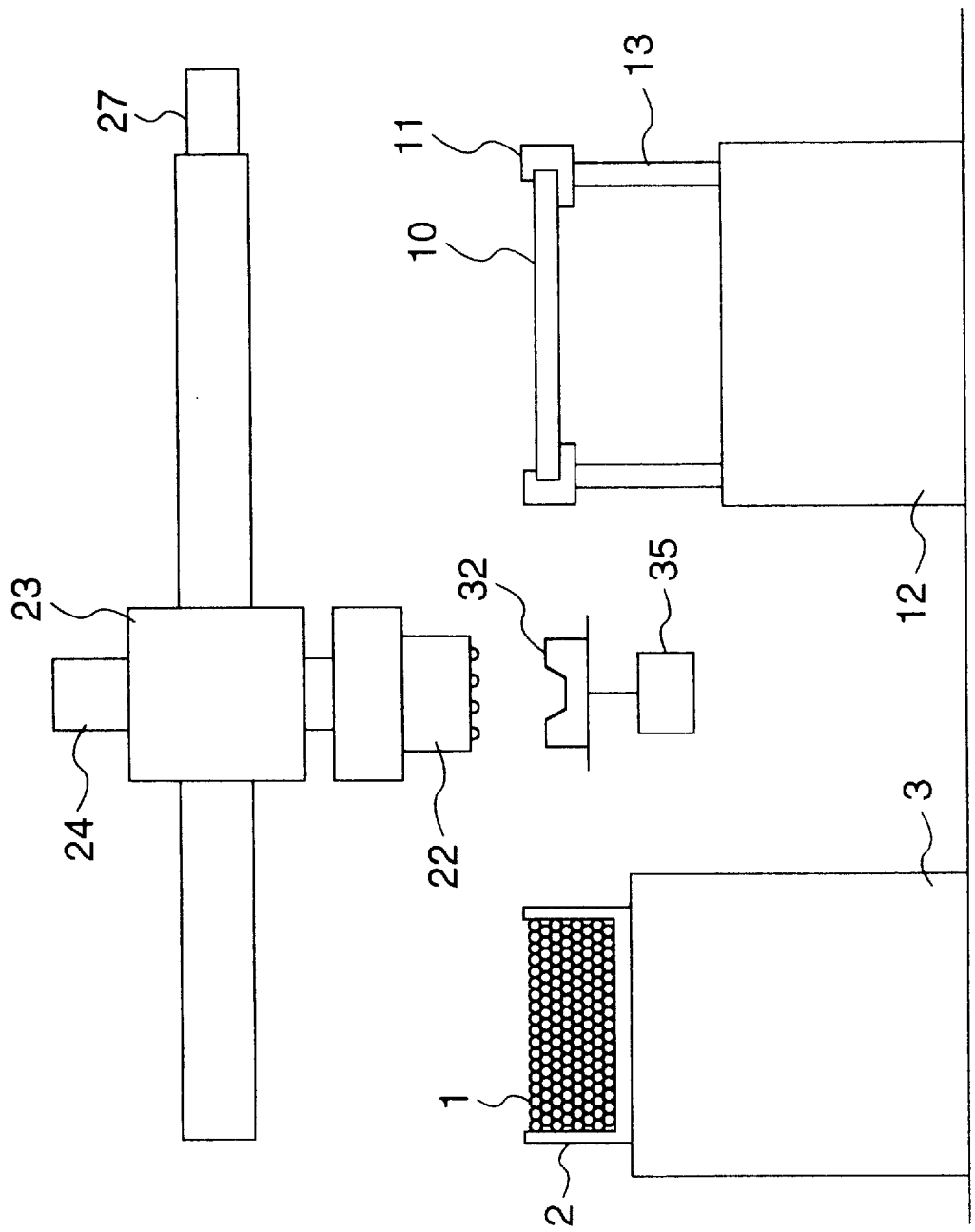

CONDUCTIVE BALL MOUNTING APPARATUS AND MOUNTING METHOD OF CONDUCTIVE BALL

BACKGROUND OF THE INVENTION

1. Field of the Invention

The present invention relates to a conductive ball mounting apparatus and a mounting method for mounting a conductive ball to form a bump on an electrode of a workpiece such as a chip or substrate.

2. Description of the Related Art

A method of using a conductive ball such as a solder ball is known as a method for forming a bump (protruded electrode) on an electrode of a workpiece in a process for manufacturing a workpiece provided with a bump such as a flip chip device. Moreover, as a method of using a conductive ball, a method is known in which a mounting head is moved above the a conductive-ball feeding section, a plurality of conductive balls are picked up by vertically moving the mounting head on the conductive-ball feeding section, and then the mounting head is moved above a workpiece to simultaneously mount the conductive balls on electrodes of the workpiece by vertically moving the mounting head on the workpiece.

However, the above conventional method has a problem that the mounting head is prone to pick up extra conductive balls (the extra conductive balls are referred to as "extra balls" in the case of the present invention) at the conductive ball feeding section, the extra balls are also erroneously mounted on a workpiece, and thus a defective workpiece is produced.

Therefore, it is an object of the present invention to provide a conductive ball mounting apparatus and mounting method of conductive balls capable of preventing at least one extra ball from being erroneously mounted on a workpiece.

SUMMARY OF THE INVENTION

A conductive ball mounting apparatus according to the present invention comprises a mounting head provided with a plurality of suction holes each of which has a recess capable of storing one conductive ball on the bottom surface of the head to suck and hold conductive balls by the recesses, moving means for moving the mounting head between the positioning section of the workpiece and the feeding section of the conductive balls, and detecting means arranged on the moving route of the mounting head, for detecting at least an extra ball erroneously attached to the bottom surface of the mounting head without being stored in the recesses of the suction holes arranged on the moving route of the mounting head.

Moreover, a conductive ball mounting method according to the present invention comprises the steps of moving, above a conductive ball feeding section, a mounting head provided with a plurality of suction holes each of which has a recess capable of storing one conductive ball on the bottom surface of the head and vertically moving the mounting head on the conductive ball feeding section to hold conductive balls by the recesses, moving the mounting head above detecting means to detect at least one extra ball erroneously attached to the bottom surface of the mounting head without being stored in the recesses, and, in a case that there is detected no extra ball, moving the mounting head above a workpiece and vertically moving the mounting head above the workpiece to mount the conductive balls on electrodes of the workpiece.

BRIEF DESCRIPTION OF THE DRAWINGS

FIG. 10 is a side view of the conductive ball mounting apparatus according to an embodiment 3 of the present invention.

According to the present invention, the extra ball erroneously attached to the mounting head is detected, and only the conducive balls on the mounting head, on which the extra ball is not detected, can be mounted on the workpiece.

DESCRIPTION OF THE PREFERRED EMBODIMENTS

Embodiment 1

Figure 1:
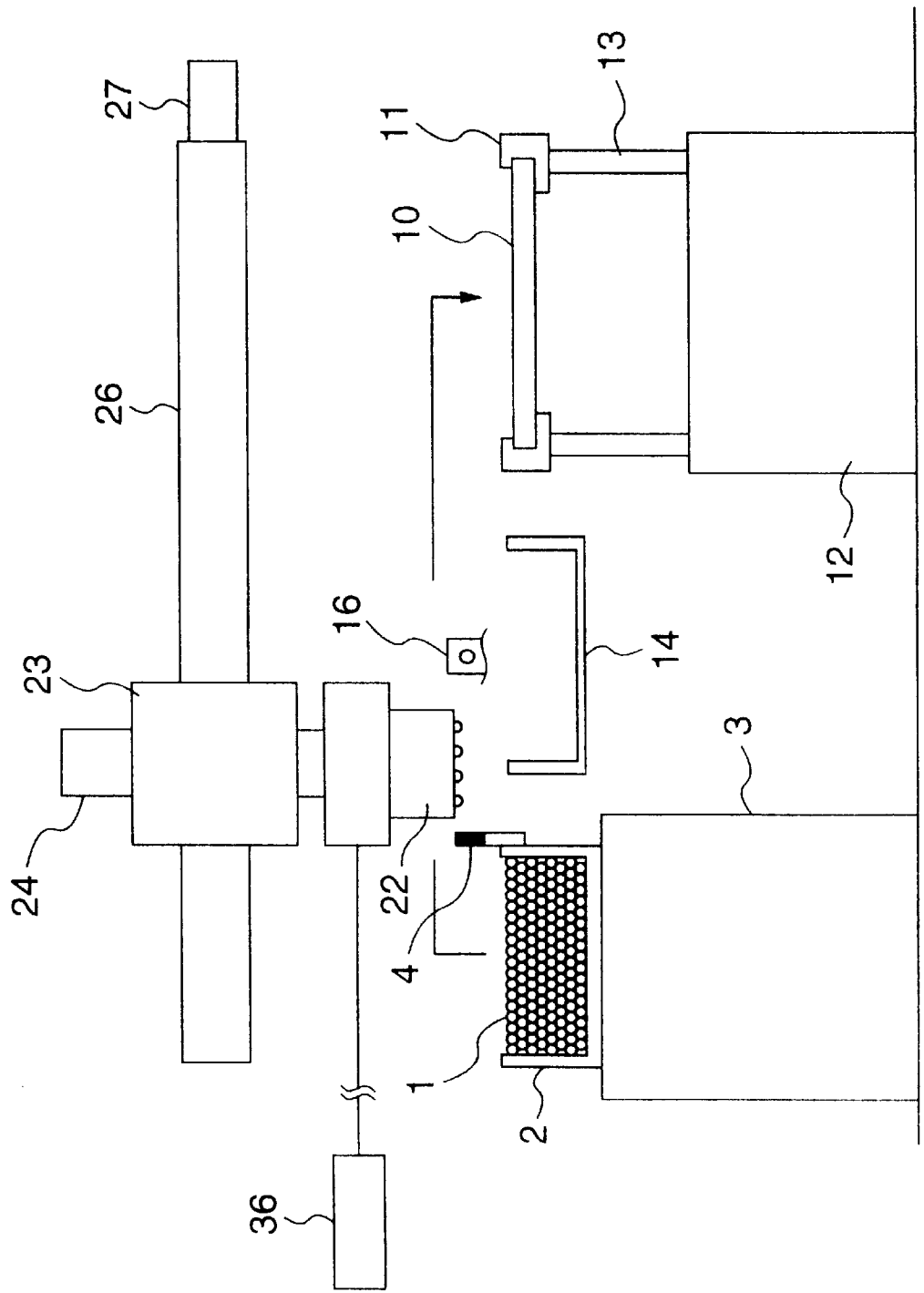
FIG. 1 is a side view of the conductive ball mounting apparatus according to an embodiment 1 of the present invention.
Figure 2:
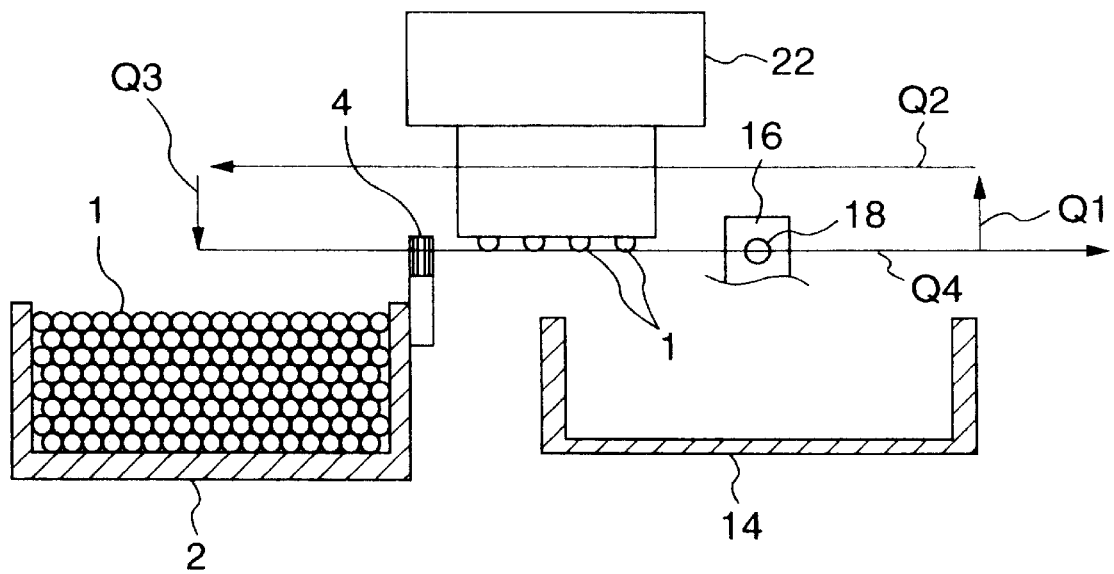
FIG. 2 is an illustration showing the state in which the conductive ball mounting apparatus according to the embodiment 1 of the present invention moves conductive balls.
Figure 3:
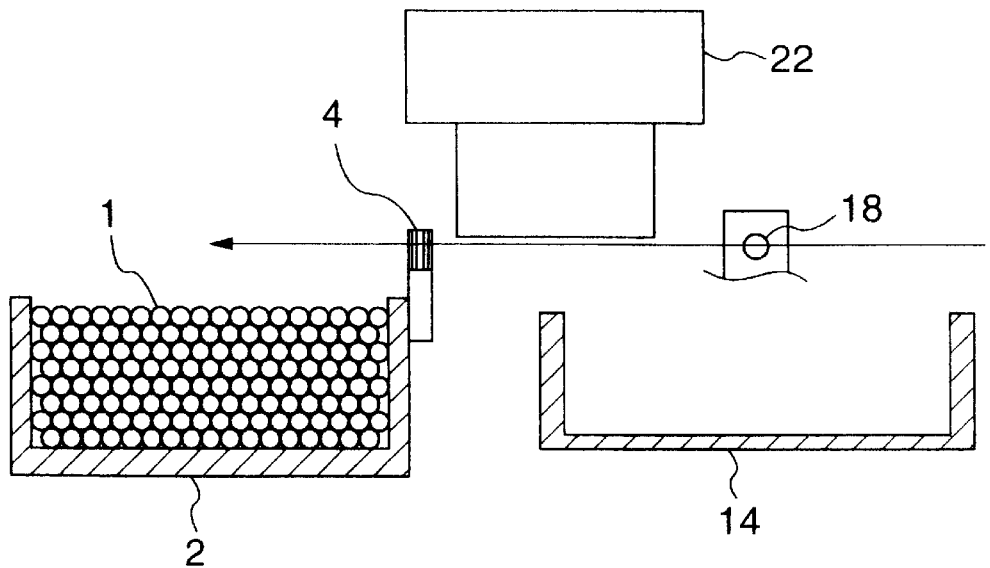
FIG. 3 is an illustration showing the state in which the conductive ball mounting apparatus according to the embodiment 1 of the present invention moves conductive balls.
Figure 4:
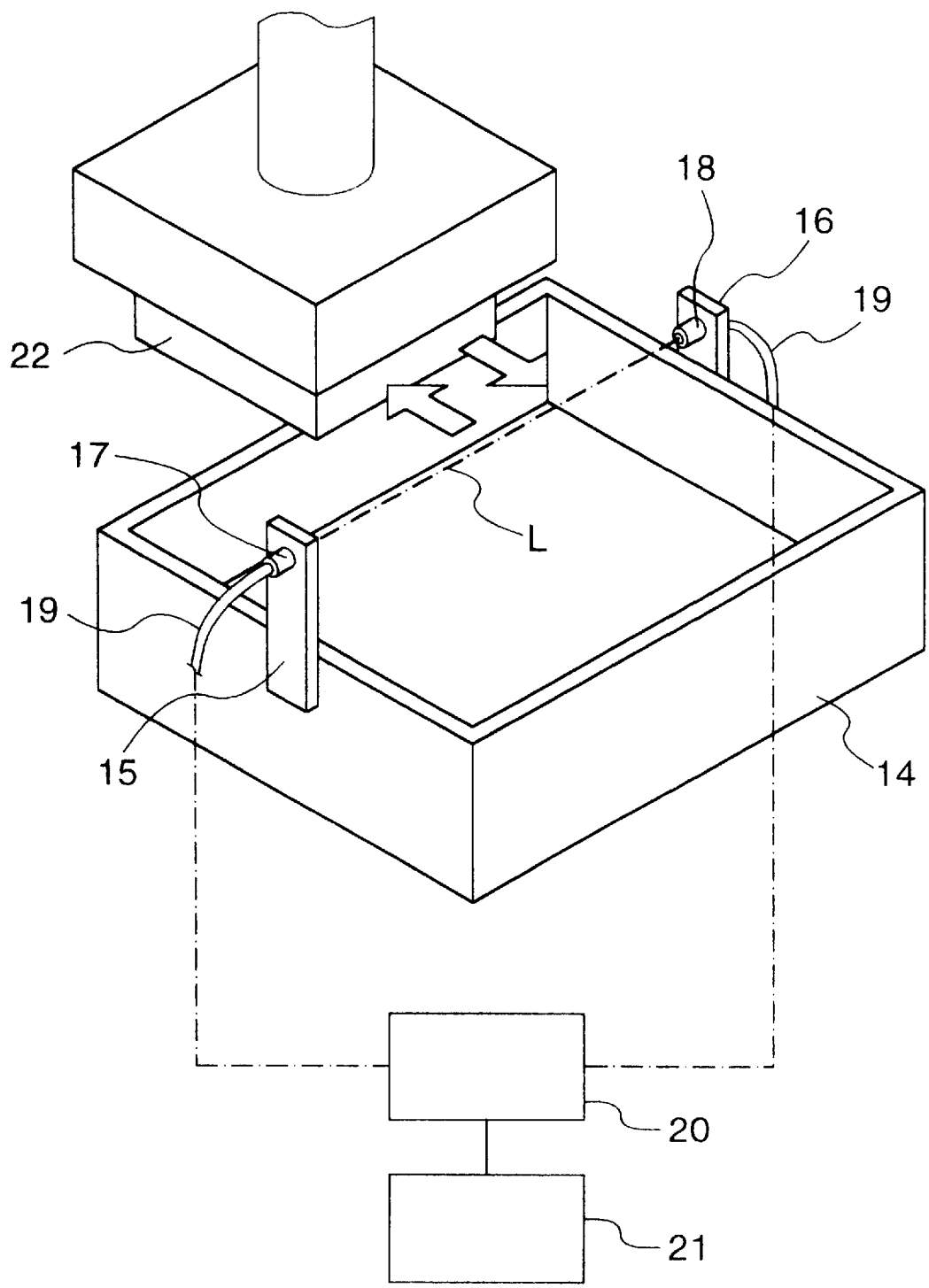
FIG. 4 is a perspective view of an extra ball detecting section of the conductive ball amounting apparatus according to the embodiment 1 of the present invention.
Figure 5:
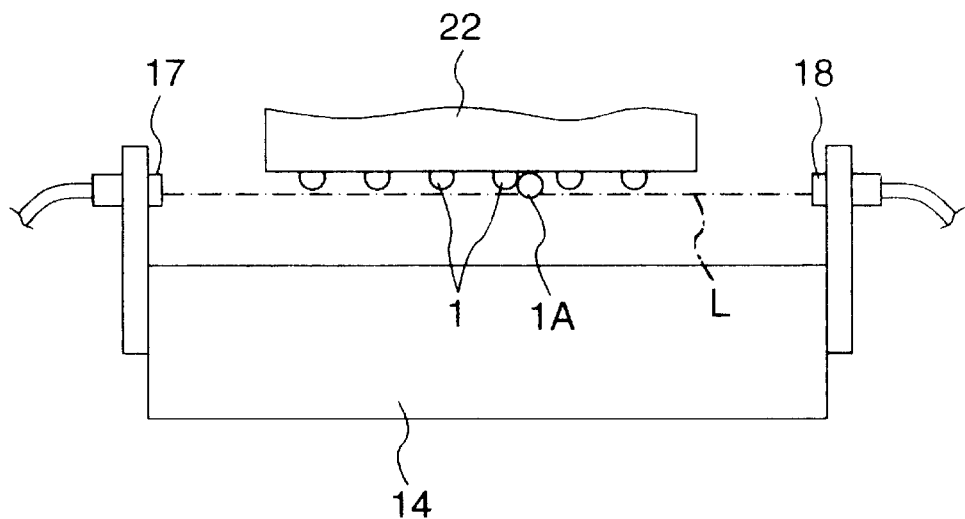
FIG. 5 is an illustration showing the state in which the conductive ball mounting apparatus according to the embodiment 1 of the present invention detects an extra ball.
Figure 6:
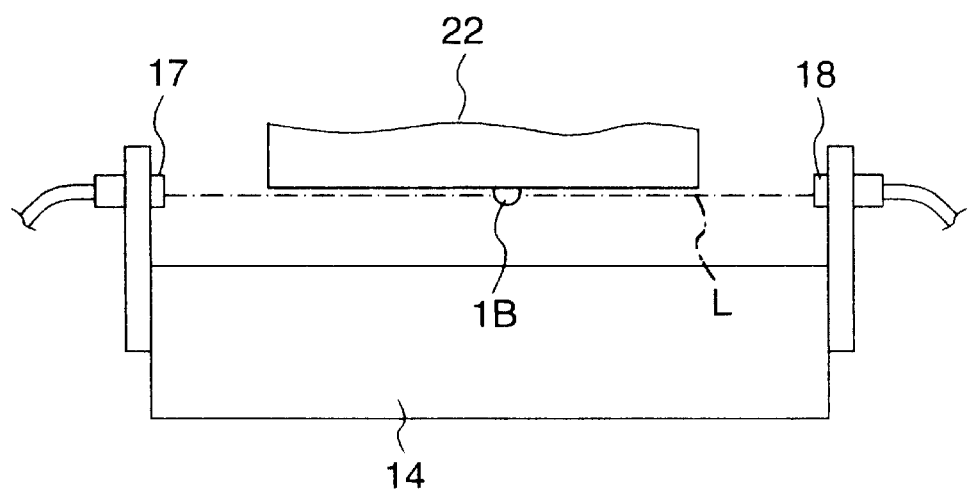
FIG. 6 is an illustration showing the state in which the conductive ball mounting apparatus according to the embodiment 1 of the present invention detects a remaining ball.
Figure 7:
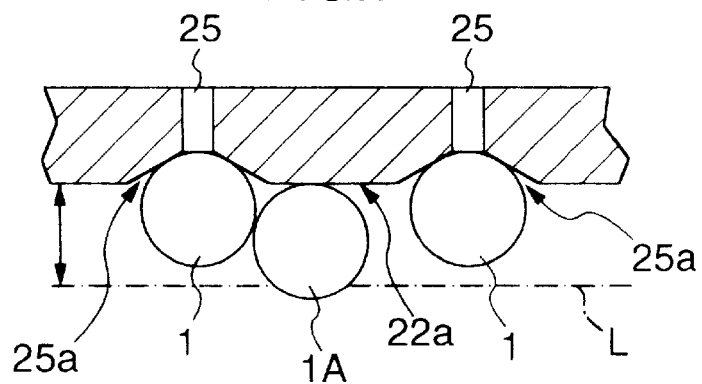
FIG. 7 is a partly enlarged view of the bottom of the conductive ball mounting apparatus according to the embodiment 1 of the present invention.

FIG. 1 is a side view of a conductive ball mounting apparatus according to an embodiment 1 of the present invention, FIGS. 2 and 3 are illustrations showing the states in which the conductive ball mounting apparatus in FIG. 1 moves conductive balls, FIG. 4 is a perspective view of the extra ball detecting section of the conductive ball mounting apparatus in FIG. 1, FIG. 5 is an illustration showing the state in which the conductive ball mounting apparatus in FIG. 1 detects an extra ball, FIG. 6 is an illustration showing the state in which the conductive ball mounting apparatus in FIG. 1 detects a remaining ball, and FIG. 7 is a partly enlarged view of the bottom of the mounting head of the conductive ball mounting apparatus in FIG. 1.

In FIG. 1, symbol 1 denotes solder balls serving as conductive balls which are stored in a container 2. Symbol 3 denotes a base for mounting the container 2. Vibrating means for vibrating the container 2 and gas feeding means for feeding gas into the container 2 are built in the base 3 in order to fluidize the solder balls 1 in the container 2. In FIG. 1, a brush 4 is protruded upward on the right wall of the container 2. The container 2 and the base 3 constitute a feeding section of the solder balls 1.

In FIG. 1, symbol 10 denotes a workpiece which is positioned by clamping it to a damper 11. The damper 11 is supported by a support 13 vertically set to a pedestal 12. The damper 11, pedestal 12, and support 13 serve as a positioning section of the workpiece 10. A case 14 serving as a collecting section of the solder balls 1 is provided between the container 2 and the workpiece 10. In the case of this embodiment, the following structure is shown in FIG. 4 as a height measuring instrument. Brackets 15 and 16 are vertically set to the both sides of the case 14. A light emitting device 17 and a photo detector 18 are mounted to the respective brackets 15 and 16 in a manner that they face with each other. The light emitting device 17 and the photo detector 18 are connected to a detecting section 20 through a cable 19. The detecting section 20 is connected to a control section 21. Symbol L denotes an optical path of the light irradiated to the photo detector 18 from the light emitting device 17. The light emitting device 17, photo detector 18, and detecting section 20 constitute extra-ball detecting means.

In FIG. 1, symbol 22 denotes a mounting head. The mounting head 22 is held at the bottom of a box 23. A motor 24 is set at the upper portion of the box 23. Vertical moving means such as a feed screw and so on to be driven by the motor 24 is built in the box 23. The mounting head 22 vertically moves when the motor 24 is driven. As shown in FIG. 7, a plurality of suction holes 25 are formed on the bottom surface of the mounting head 22. The mounting head 22 is connected to an air pressure control unit 36 provided with an air supply for supplying compressed air and a vacuum source for vacuum-sucking. When the suction head 22 is connected with the vacuum source by the air pressure control unit 36, the suction head 22 holds the solder ball 1 in the suction hole 25 due to vacuum-sucking, and drops the solder ball 1 when the suction head 22 is connected with the air supply to cancel the vacuum suction state.

The suction hole 25 is provided with a tapered recess 25a capable of storing only one solder ball 1 and the solder ball 1 is stored in the recess 25a when it is normally sucked. However, because an extra ball 1A is not stored in a recess but it attaches to the bottom surface 22a of the mounting head 22, a difference in height is arisen between the extra ball 1A and the normally attracted sucked solder ball 1. The conductive ball mounting apparatus of the embodiment 1 makes it possible to detect the extra ball 1A separately from the normally sucked solder ball 1 by using the difference in height between the normal solder ball 1 and the extra ball 1A.

The box 23 is held by a horizontally extending table device 26 serving as moving means. A feed screw mechanism is built in the table device 26. When the motor 27 is driven to operate the feed screw mechanism, the mounting head 22 horizontally moves between the container 2, case 14, and workpiece 10.

The conductive ball mounting apparatus is constituted as described above and its operations are described below. In FIG. 1, the mounting head 22 moves above the container 2 and performs vertical motions on the container 2 to pick up the solder ball 1 by vacuum-sucking the ball 1 to the suction hole 25 on the bottom surface of the head 22. FIG. 7 shows the bottom of the mounting head 22 picking up the solder balls 1. As illustrated, though one solder ball 1 is sucked to each suction hole 25, one extra conductive ball 1A is also sucked in FIG. 7. If the extra ball 1A is mounted on the workpiece 10, the workpiece 10 would become a defective product. Therefore, it is not permitted to mount the extra ball 1A on the workpiece 10. The extra ball 1A is produced due to attachment of solder balls with each other due to static electricity or vacuum leakage of the suction hole 25.

In FIG. 1, the mounting head 22 picking up the solder balls 1 moves toward the workpiece 10 (also see FIG. 2). In this case, the mounting head 22 passes through the upper side of the brush 4 and the upper end of the brush 4 slidably contacts the solder balls 1 held at the bottom of the mounting head 22. Among the solder balls shown in FIG. 7, each of the normal solder balls 1 directly correctly vacuum-sucked to one of the suction holes 25 does not drop even if the brush 4 slidably contacts the normal solder ball 1 because the solder ball 1 is strongly vacuum-sucked and held. However, because the extra ball 1A is held by a small force such as static electricity, it drops when contacting the brush 4 and is collected in the container 2. By setting the brush 4 on a moving route of a mounting head and bringing the brush 4 into slidable contact with the solder balls 1, as this embodiment, it is possible to easily drop and remove the extra ball 1A while moving the solder balls 1 to the workpiece 10. Moreover, by setting the brush 4 to the container 2, it is possible to collect the extra ball 1A dropped by the brush 4 directly in the container 2.

Then, the mounting head 22 passes between the light emitting device 17 and the photo detector 18 as shown in FIG. 5. As shown in FIGS. 5 and 7, the mounting head 22 is set to a height at which the optical path L is not intercepted by the normal solder balls 1 but it is intercepted by the extra ball 1A protruded more downward than the normal solder balls 1. Of course, the height of the mounting head 22 is adjusted by driving the motor 24. As described above, the extra ball 1A is dropped due to slidable contact by the brush 4. However, dropping of the ball 1A due to slidable contact by the brush 4 is not always successful. As shown in FIGS. 5 and 7, the extra ball 1A may still remain. In this case, the extra ball 1A is detected by interrupting the optical path L.

As described above, there are various corresponding methods when the extra ball 1A is detected and, some of the methods are described below. In the case of the first method, all of the solder balls 1 and extra balls 1A held by the mounting head 22 are dropped and collected in the case 14 by stopping the mounting head 22 above the case 14 and jetting air from the suction holes 25 due to operating the air pressure control unit 36 in the converse direction, or canceling the vacuum suction state. Then, the mounting head 22 is returned above the container 1, and the picking-up operation is retried.

In the case of the second method, the mounting head 22 is returned above the container 2 as shown by the arrows Q1, Q2, and Q3 in FIG. 2 and the upside of the brush 4 is moved again as shown by the arrow Q4 to retry the dropping of the extra ball 1A due to slidable contact by the brush 4.

In the case of the third method, the mounting head 22 is returned above the container 2 and is lowered to insert the bottom thereof into the layers of the solder balls 1 stored in the container 2 in large quantities. The motor 27 is and normally and reversely driven in the above state, and thereby the mounting head 22 is crosswise scrubbed to forcibly vibrate and drop the extra ball 1A. As described above, the extra ball 1A can be removed by various methods.

The mounting head 22 from which every extra ball 1A is removed moves above the workpiece 10 in FIG. 1. Then, the mounting head 22 lowers to place each of solder balls 1 on one of the electrodes of the workpiece 10. Then, by canceling the vacuum suction state of the solder ball 1 and raising the mounting head 22, the solder ball 1 is mounted on the electrode of the workpiece 10. The workpiece 10 on which the solder ball 1 is mounted is sent to a heating furnace (outside of the drawing) and a bump is formed by heating, melting, and solidifying the solder ball 1. Flux is necessary to heat and melt the solder ball 1. The flux is applied to the bottom of the solder ball 1 held on the bottom surface of the mounting head 22 or the electrode of the workpiece 10 by non-illustrated means.

As described above, the mounting head 22 mounts the solder balls 1 on the workpiece 10 and then returns above the container 2. FIGS. 3 and 6 show the mounting head 22 passing above the case 14 in the returning step. Symbol 1B denotes a solder ball remaining on the bottom surface of the mounting head 22 (hereafter referred to as "remaining ball"). The remaining ball 1B remains on and attaches to the bottom surface of the mounting head 22 because it is unsuccessful to mount the ball 1B on the workpiece 10.

The remaining ball 1B is detected by interrupting the optical path L. Incidentally, as the motor drives to make the position of the mounting head 22 in the forward part of the moving route lower than that in the backward part, or the case 14 is made slightly higher by the lifter out of the drawing, the remaining ball 1B intercepts the optical path L, as shown in FIG. 6, so as to detect the ball 1B.

When the remaining ball 1B is detected, it is found that the previous workpiece 10 is a defective product having an insufficient number of solder balls. Therefore, it is necessary to remove the workpiece 10 from the line or supply the solder ball 1 onto an electrode on which the solder ball 1 is not present by separate recovering means. Moreover, in FIG. 6, by jetting air from the suction hole 25 of the mounting head 22, the remaining ball 1B is forcibly dropped and collected in the box 14. Then, the mounting head 22 is returned above the container 2 and the above operations are repeated.

Embodiment 2

Figure 8:
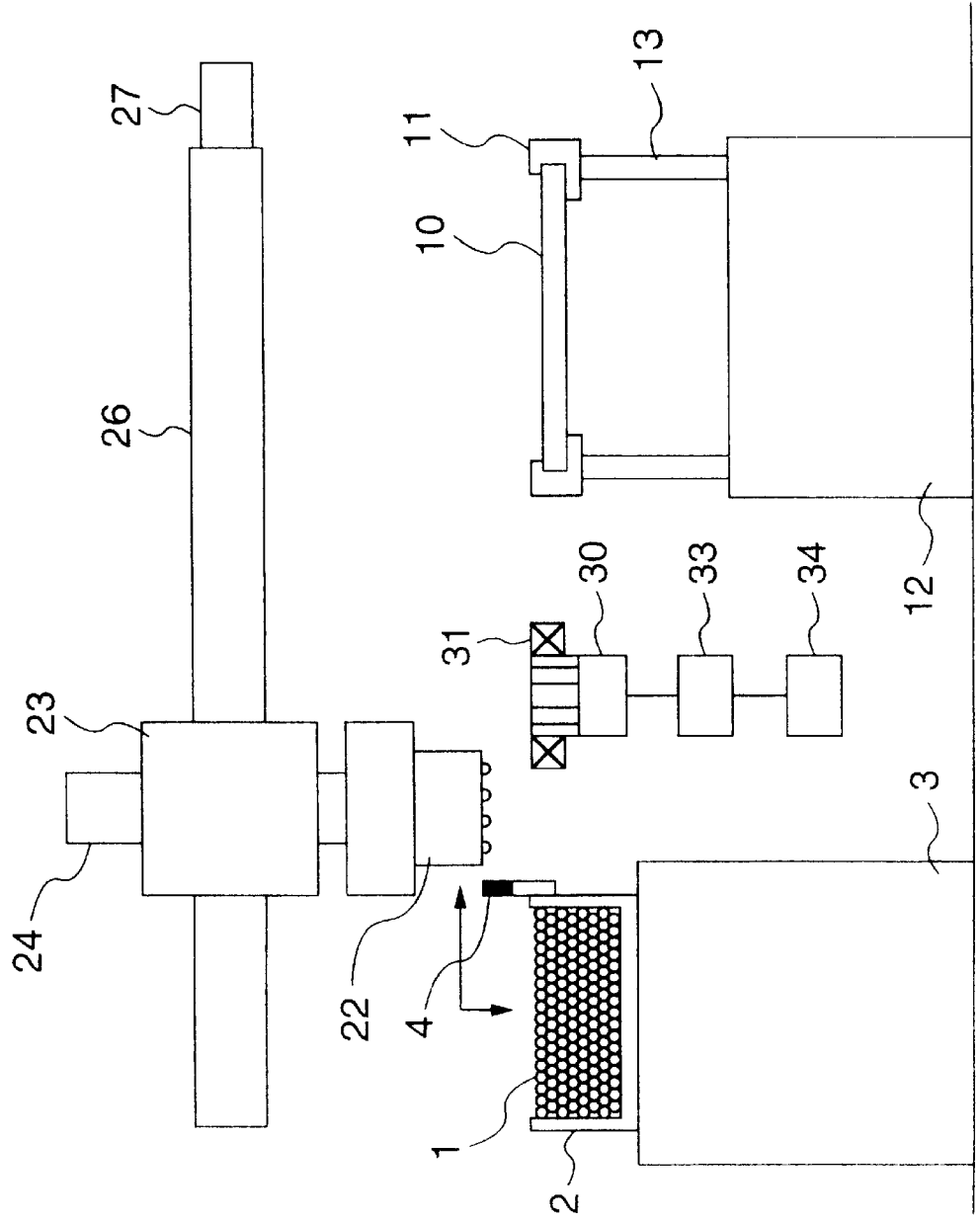
FIG. 8 is a side view of the conductive ball mounting apparatus according to an embodiment 2 of the present invention.
Figure 9:
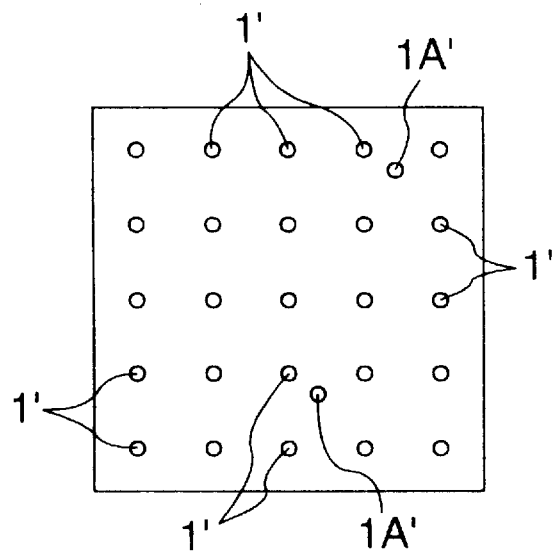
FIG. 9 is a contrast image diagram of a camera of the conductive ball mounting apparatus of the embodiment 2 of the present invention.

FIG. 8 is a side view of the conductive ball mounting apparatus according to an embodiment 2 of the present invention and FIG. 9 is a contrast image diagram of a camera in the embodiment 2. Symbol 30 denotes a camera and 31 denotes a light source for emitting illumination light upward, serving as a height measuring instrument. The camera 30 and the light source 31 are set under the moving route of the mounting head 22 instead of the light emitting device 17 and the photo detector 18. The mounting head 22 picking up the solder balls 1 in the container 2 moves above the camera 30 and is observed by the camera 30. An image obtained by the camera 30 is sent to an image processing unit 33 and processed there. According to the processing result, a control section 34 controls the operation of each section.

FIG. 9 shows an image obtained by the camera 30. The solder ball 1 is a glossy metallic sphere. When light is applied to the solder ball 1 from the lower side, only the light entering the center of the solder ball 1 is intensely reflected downward and enters the camera 30. Therefore, only the center of the solder ball 1 is brightly observed. Moreover, it is preferable to coat the bottom of the mounting head 22 with a dark color such as black so that the camera 30 observes that the bottom surface be black. In FIG. 9, symbol 1' denotes the image of a normal solder ball and 1A' denotes the image of an extra ball. Though the solder ball 1 normally attracted to the suction hole 25 is detected at a position coinciding with the suction hole 25, an extra ball is detected at a position unrelated to the suction hole 25. Therefore, it is possible to easily detect the presence of an extra ball 1A by analyzing an image obtained from the camera 30 by the generally-known image processing art.

Embodiment 3

Figure 11:
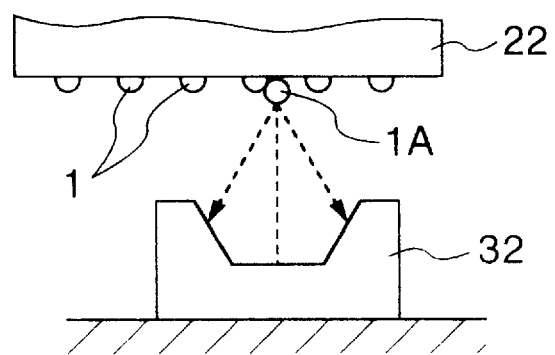
FIG. 11 is a partly side view of the conductive ball mounting apparatus according to the embodiment 3 of the present invention.

FIG. 10 is a side view of the conductive ball mounting apparatus according to embodiment 3 of the present invention and FIG. 11 is a partly side view of the apparatus in FIG. 10. Symbol 32 denotes a laser unit serving as a height measuring instrument which is set under the moving route of the mounting head 22 instead of the light emitting device 17 and the photo detector 18.

By emitting a laser spotlight from the height measuring instrument 32 to scan the whole bottom of the mounting head 22 with the laser spotlight and receiving the reflected light, it is possible to detect the height distribution of the bottom of the mounting head 22. Because the extra ball 1A is protruded further downward than the solder ball 1 normally sucked to the suction hole 25, it is possible to distinguish the ball 1A from the ball 1 in height. By analyzing the height distribution by the generally-known analyzing art, it is possible to easily confirm whether the extra ball 1A is present. In accordance with the analysis result, each section is controlled by a control section 35 similarly to the case of the previously described embodiment.

Moreover, the present invention allows various design modifications. For example, it is possible to detect the remaining ball 1B shown in FIG. 6 by the camera 30 shown in FIG. 8 or the laser unit 32 shown in FIG. 10. Furthermore, it is possible to use not only a solder ball but also a gold ball as a conductive ball.

According to the present invention, it is possible to detect an extra ball erroneously attached to a mounting head and mount only conductive balls on the mounting head on which no extra ball is detected on a workpiece. Moreover, it is possible to easily detect a remaining ball which is still present after mounting conductive balls on a workpiece.

What is claimed is:

1. A conductive ball mounting apparatus comprising:
   a workpiece positioning section;
   a conductive ball feeding section;
   a mounting head provided with a plurality of suction holes each of which has a recess for storing one conductive ball on a bottom surface of the head to hold conductive balls by sucking them to said recesses;
   moving means for moving said mounting head along a moving route between said workpiece positioning section and said conductive ball feeding section; and
   detecting means, arranged adjacent the moving route of said mounting head, for detecting, when said mounting head is being moved from said conductive ball feeding station to said workpiece positioning section, at least one extra ball that is erroneously additionally attached to the bottom surface of said mounting head without being stored in any one of said recesses and for detecting at least one remaining ball on the mounting head when the mounting head is being moved from said workpiece positioning section to the conductive ball feeding section after said conductive balls have been mounted on a workpiece at said workpiece positioning section.

2. A conductive ball mounting apparatus according to claim 1, wherein said detecting means is provided with an optical device having an optical path which is not intercepted by normal conductive balls vacuum-sucked to said suction holes but is intercepted by said extra ball.

3. A conductive ball mounting apparatus according to claim 1, wherein said detecting means is provided with a camera for observing from the lower side the extra ball erroneously additionally attached to the bottom surface of said mounting head without being stored in the recesses of said suction holes.

4. A conductive ball mounting apparatus according to claim 1, wherein said detecting means is provided with a height measuring instrument for detecting the extra ball erroneously additionally attached to the bottom surface of said mounting head without being stored in the recesses of said suction holes and protruded further downward than the conductive balls normally vacuum-sucked to said suction holes.

5. An apparatus according to claim 1, wherein said moving means moves said mounting head closer to said detecting means when moving said mounting head from said workpiece positioning section to said conductive ball feeding section than when moving said mounting head from said conductive ball feeding section to said workpiece positioning section.

6. A conductive ball mounting method comprising the steps of:

moving a mounting head provided with a plurality of suction holes each of which has a recess capable of storing one conductive ball on a bottom surface of the head above a conductive ball feeding section and vertically moving said mounting head above the section to hold conductive balls in said recesses;

moving said mounting head above a detecting means to detect at least one extra ball erroneously additionally attached to the bottom surface of said mounting head; and moving said mounting head above a workpiece when no extra ball is detected and vertically moving said mounting head above said workpiece to mount conductive balls on electrodes of said workpiece.

7. A conductive ball mounting method comprising the steps of:

(a) sucking conductive balls by means of a mounting head;

(b) detecting at least one extra conductive ball by passing the mounting head through a detecting position of a detecting means for detecting the conductive balls projecting from a bottom surface of the mounting head;

(c) if there is no extra ball, moving the mounting head to the next step;

(d) mounting the conductive balls sucked by said mounting head on a workpiece; and (e) detecting at least one conductive ball remaining on said mounting head by passing said mounting head through a detecting position of said detecting means.

8. A conductive ball mounting method according to claim 7, wherein said mounting head moves in opposite directions in steps (b) and (e).

9. A conductive ball mounting method according to claim 7, wherein said mounting head moves closer to said detecting means during step (e) than during step (b).

* * * * *